United States Patent
Rahim et al.

(10) Patent No.: US 7,170,308 B1
(45) Date of Patent: Jan. 30, 2007

(54) ON-CHIP VOLTAGE REGULATOR USING FEEDBACK ON PROCESS/PRODUCT PARAMETERS

(75) Inventors: Irfan Rahim, Milpitas, CA (US); Peter McElheny, Morgan Hill, CA (US); John Costello, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/628,711

(22) Filed: Jul. 28, 2003

(51) Int. Cl.
*G01R 31/00* (2006.01)
*G01R 31/28* (2006.01)
*G05F 1/00* (2006.01)

(52) U.S. Cl. .................. 324/765; 324/763; 324/158.1; 323/268; 323/285; 714/733

(58) Field of Classification Search ........ 324/750–765; 323/266, 268, 285; 702/64; 714/733
See application file for complete search history.

(56) References Cited

U.S. PATENT DOCUMENTS

| | | | | |
|---|---|---|---|---|
| 5,319,302 A | * | 6/1994 | Koshikawa et al. | ........ 323/273 |
| 5,440,520 A | * | 8/1995 | Schutz et al. | ................ 365/226 |
| 5,864,225 A | * | 1/1999 | Bryson | ........................ 323/268 |
| 6,140,831 A | * | 10/2000 | Loughmiller | ................ 324/765 |
| 6,424,128 B1 | * | 7/2002 | Hiraki et al. | ................ 323/268 |
| 6,541,948 B1 | * | 4/2003 | Wong | .......................... 323/284 |
| 6,683,767 B2 | * | 1/2004 | Ito et al. | ........................ 361/56 |
| 6,744,242 B1 | * | 6/2004 | Giacomotto et al. | ........ 323/269 |

* cited by examiner

*Primary Examiner*—Vinh Nguyen
*Assistant Examiner*—Emily Y Chan
(74) *Attorney, Agent, or Firm*—Morgan, Lewis & Bockius LLP

(57) ABSTRACT

The present invention optimizes the performance of integrated circuits by adjusting the circuit operating voltage using feedback on process/product parameters. To determine a desired value for the operating voltage of an integrated circuit, a preferred embodiment provides for on-wafer probing of one or more reference circuit structures to measure at least one electrical or operational parameter of the one or more reference circuit structures; determining an adjusted value for the operating voltage based on the measured parameter; and establishing the adjusted value as the desired value for the operating voltage. The reference circuit structures may comprise process control monitor structures or structures in other integrated circuits fabricated in the same production run. In an alternative embodiment, the one or more parameters are directly measured from the integrated circuit whose operating voltage is being adjusted.

5 Claims, 2 Drawing Sheets

ON-CHIP VOLTAGE REGULATOR USING FEEDBACK ON PROCESS/PRODUCT PARAMETERS

BACKGROUND OF THE INVENTION

The present invention relates generally to integrated circuits and in particular to providing integrated circuits with optimized operating voltages.

Although the manufacture of integrated circuits is carefully controlled, inherent variations in the fabrication process cannot be avoided. These process-related variations translate into variations of functional and electrical parameters of the manufactured devices and affect the device performance. One example of a parameter that may be subject to variations during the manufacturing process is temperature. Of course, there are numerous other process parameters that may vary, as well. The resulting device parametric variations occur from lot to lot and from wafer to wafer, but also within wafers and even within dice. They can cause variations in timing performance and operating margin of the fabricated integrated circuits.

Device parametric variations due to process variations can be considerable in magnitude and therefore have a critical impact on the yield of the fabrication process. Because of this, circuit designers have to accommodate these variations when designing the circuit. Specifically, they have to design the circuit so as to meet the specification not only at optimal fabrication conditions but at process corners. However, performance requirements are difficult to achieve at the process corners. The designer thus has to weigh the goals of high performance and high yield, forcing him to make a trade-off between the two goals.

SUMMARY OF THE INVENTION

The present invention uses the adjustment of the operating voltage of integrated circuits to optimize circuit performance and achieve higher yield per wafer. The adjustment is made based on one or more measured product parameters affected by process variations.

In one embodiment, the present invention provides a method of determining a desired value for an operating voltage of an integrated circuit. The method comprises the steps of: on-wafer probing one or more reference circuit structures to measure at least one parameter of the one or more reference circuit structures; determining an adjusted value for the operating voltage based on the measured parameter; and establishing the adjusted value as the desired value for the operating voltage of the integrated circuit. In this embodiment, the reference circuit structures are structures distinct from the integrated circuit whose operating voltage is being adjusted but fabricated in the same production run. Process control monitor structures or other integrated circuits fabricated on the same wafer or in the same lot as the integrated circuit whose operating voltage is being adjusted may be suitably used as reference circuit structures.

In another embodiment, method comprises the steps of: measuring at least one parameter of one or more circuit structures of an integrated circuit; determining an adjusted value for the operating voltage based on the measured parameter; and establishing the adjusted value as the desired value for the operating voltage of that integrated circuit.

The parameter to be measured is preferably an electrical or functional parameter of the integrated circuit or the probed reference circuit structure, e.g., a leakage (stand-by) current or a circuit operating speed. Of course, more than one parameter may be measured and used for adjusting the operating voltage. Advantageously, any parameter measurement is made while operating the examined circuit structures, whether reference structures or structures of the integrated circuit itself, at a voltage having the nominal value.

In still other embodiments, the present invention provides methods of providing an operating voltage to an integrated circuit using a voltage regulator. The voltage regulator comprises: a voltage down-converter arranged to convert a chip-external supply voltage to a converted voltage based on a signal indicative of a desired value of the converted voltage, and output the converted voltage as the operating voltage; and an adjustable signal generator for adjustably generating the signal indicative of the desired value of the converted voltage. In these embodiments, the signal generator is adjusted dependent on at least one measured electrical or operational parameter of one or more reference circuit structures or at least one measured electrical or operational parameter of one or more circuit structures of the integrated circuit.

In a preferred embodiment, the voltage regulator is an on-chip regulator.

BRIEF DESCRIPTION OF THE DRAWINGS

In the following, the present invention is described in more detail by way of example only, and not by way of limitation, in conjunction with the accompanying drawings, wherein.

DETAILED DESCRIPTION OF THE INVENTION

With the trend in integrated circuit fabrication technology to reduced characteristic lengths, the operating voltage for an integrated circuit also needs to be reduced. This is due primarily to the reduction in breakdown voltage as circuit structures are more densely packed and therefore distances between critical circuit structures are reduced. Voltage regulation becomes an important issue at reduced circuit operating voltages. In order to provide operating voltages as low as, e.g., 3.3 V, 2.5 V, 1.8 V, 1.2 V or less, that are needed by modern integrated circuits fabricated in sub-micron or nanometer technology, a voltage regulator is required that performs down-conversion from a supply voltage of typically 5 V or 12 V. To maintain tight regulation with low fluctuation of the regulated voltage, the trend is to use on-chip voltage regulators, i.e., regulators integrated on the same chip as the integrated circuit.

Figure 1:
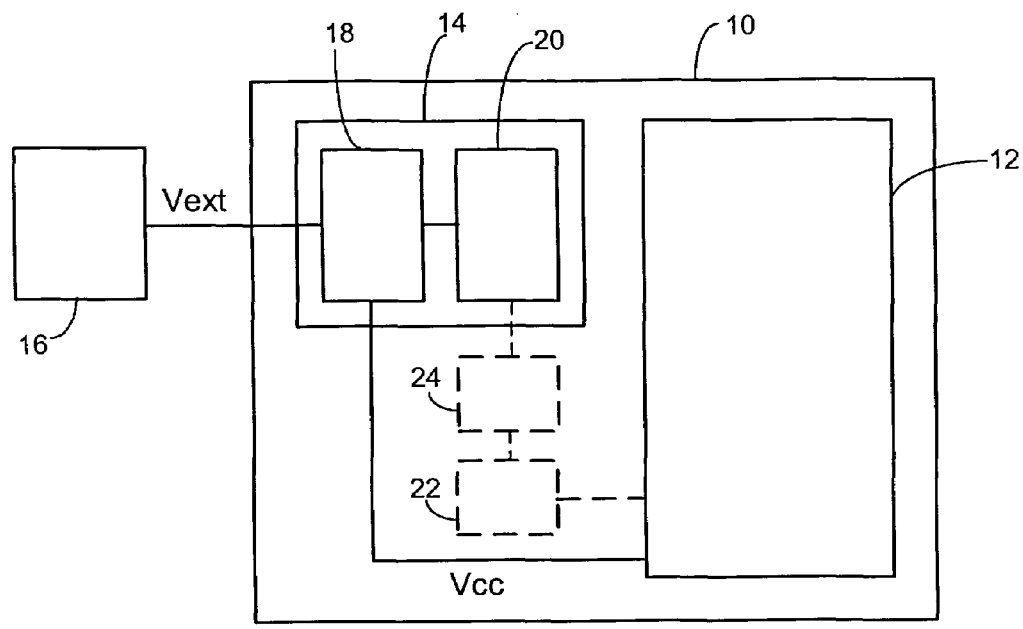
FIG. 1 is a schematic diagram of an integrated circuit chip incorporating an on-chip voltage regulator, in accordance with preferred embodiments of the present invention.

FIG. 1 illustrates a semiconductor chip 10 having built thereon an integrated circuit 12 and an on-chip voltage regulator 14. A chip-external power supply 16, which may be arranged on the same printed circuit board (not shown) as the semiconductor chip 10, delivers a supply voltage Vext of, e.g., 5 V. The integrated circuit 12 requires an operating voltage VCC lower than the supply voltage Vext. For example, it may be specified as requiring a nominal operating voltage of 3.3 V, 2.5 V or 1.8 V. The voltage regulator 14 receives the supply voltage Vext and outputs the voltage VCC, which is fed to the integrated circuit 12. Specifically, the voltage regulator 14 includes a down-converter section 18 and a signal generator section 20. The signal generator section 20 generates a signal representative of a target value of the output voltage VCC and supplies it to the down-converter section 18. The down-converter section 18 performs down-conversion of Vext and regulates the converted voltage to the target value as given by the signal from the signal generator section 20. The signal generator section 20 is adjustable or trimmable, so that the target value of VCC may be varied. Hence, by suitably adjusting the signal generator section 20, a desired value of VCC can be obtained.

While only one integrated circuit 12 is illustrated in FIG. 1 for the sake of simplicity, a person versed in the art will easily appreciate that two or more integrated circuits 12 may be fabricated on chip 10, which may all receive their operating voltage from voltage regulator 14. Each integrated circuit 12 can be any type of circuit, digital or analogue. Its circuit technology (e.g., CMOS, bipolar or hybrid), fabrication technology and function are not critical to the invention. Possible realizations of the integrated circuit 12 comprise, but are not limited to, a processor, a programmable logic device (PLD), an application-specific integrated circuit (ASIC), etc.

Due to variations in the manufacturing process, performance parameters of integrated circuits, such as, for example, operating speed, output leakage current, and power consumption, may vary from chip to chip. These variations can be so large that some of the integrated circuits may, and typically do, fail to meet the specification, with the result that they have to be discarded. For example, higher leakage current Ioff of an integrated circuit generally implies higher circuit supply current ICC. In deep sub-micron chip fabrication technology, the leakage current Ioff may become very large, especially at process corners when all process-related variations are taken into account, leading to too high a supply current ICC.

Performance-characterizing parameters of an integrated circuit usually depend on the operating voltage of the circuit. Thus, varying the circuit operating voltage is typically accompanied by concomitant variations in one or more of these parameters. For example, lowering the operating voltage typically lowers the leakage current of an integrated circuit. On the other hand, increasing the operating voltage may increase the circuit operating speed.

The production yield in chip fabrication can be enhanced by adjusting the operating voltage of integrated circuits based on measurements made of electrical or operational parameters of (1) select reference circuit structures fabricated in the same production run as the integrated circuits or (2) the integrated circuits themselves. Specifically, the circuit operating voltage is adjusted from a pre-set nominal value by an adjustment amount determined from the measured data. Suitably adjusting the operating voltage can make integrated circuits acceptable whose performance parameters would otherwise have been outside the specification. In this way, a significantly higher yield can be achieved. As an example, rough calculations have shown that on 90 nm technology up to about 10% of the total die area on a wafer can be recovered.

Figure 2:
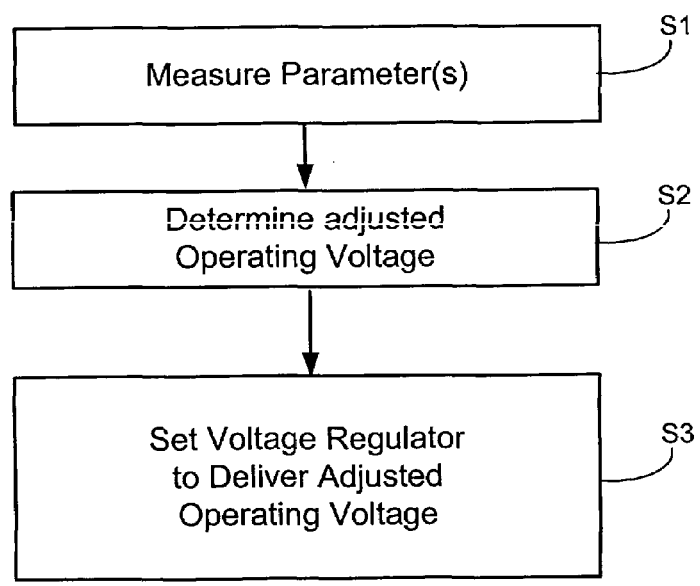
FIG. 2 is a flow diagram of method steps for optimizing an output voltage delivered by the voltage regulator of FIG. 1.

FIG. 2 illustrates steps to be taken in order to optimize the operating voltage for the integrated circuit 12 shown in FIG. 1. In step S1, data are acquired by measuring one or more performance-characterizing parameters of one or more circuit structures. As indicated above, these circuit structures can be reference circuit structures fabricated preferably in the same lot or on the same wafer as the integrated circuit 12. It is equally possible to obtain performance-characterizing data from direct measurements of the integrated circuit 12. Advantageously, the one or more parameters are measured under nominal operating conditions of the probed circuit structures. Specifically, the parameters are measured while the nominal operating voltage as specified by the designer is applied to the probed circuit structures.

Following step S1, an adjusted target value for the operating voltage of the integrated circuit 12 is determined in step S2 based on the acquired measurement data. For example, in a case where the integrated circuit 12 is designed for a nominal operating voltage of 1.8 V, an optimized value for the operating voltage may be, e.g., 1.7 V if the measured data indicate that the leakage current Ioff of the integrated circuit 12 is, or is likely to be, too high at the nominal operating voltage. On the other hand, increasing the operating voltage to, e.g., 1.9 V may compensate for unacceptable slowness of the circuit operating speed at the nominal operating voltage. Evaluation of the measurement data and determination of the adjusted target value for the operating voltage may be made based on empiric information or using mathematical algorithms or formulas. Of course, if the evaluation of the measured data reveals that the examined parameters are in fact within acceptable limits, no adjusted target value for the operating voltage is determined. Rather, the nominal value as given in the device specification is established as the target value for the operating voltage.

Finally, in step S3, the voltage regulator 14 is set so as to deliver the adjusted operating voltage. Specifically, the signal generator 20 is set so that the signal delivered by the signal generator section 20 to the down-converter section 18 is indicative of the adjusted target value for the output voltage VCC as determined in step S2.

Figure 3:
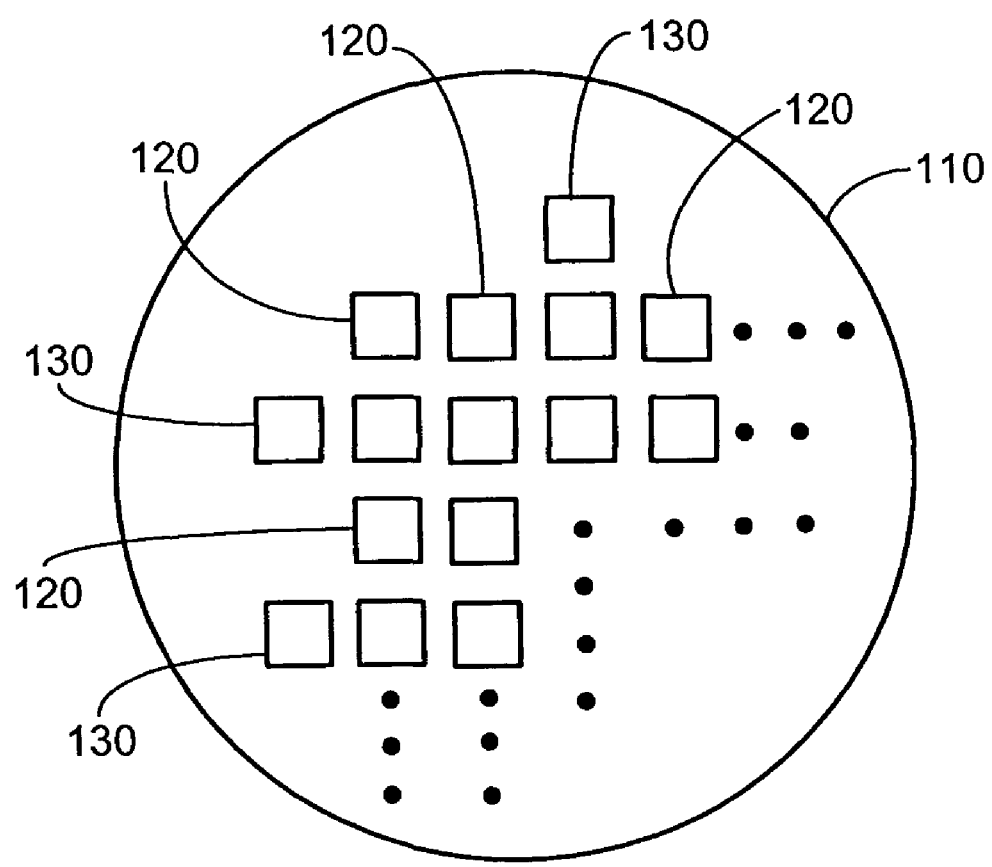
FIG. 3 is a schematic view of a wafer having built thereon a number of integrated circuit chips and process control monitor structures.

So-called process control monitor (PCM) structures are one advantageous example of reference circuit structures suitable for being probed for performance-characterizing parameters. Conventionally, when fabricating a wafer, a set of test structures, e.g., individual transistors, diodes or other circuit elements, is fabricated on the wafer in addition to the integrated circuits proper. These test structures are known as the PCM structures. They may be implemented as separate cells on extra wafer area or integrated side by side with the integrated circuits on the same die area. The PCM structures are strategically distributed across the wafer so as to deliver representative data for all areas of the wafer. After fabrication of the wafer, tests for operational and electrical parameters (also referred to as Process Control Monitor or E-Test) are carried out on the PCM structures using suitable test equipment. Measurement data originating from this parametric testing can be used to refine the manufacturing process. For the purpose of illustration only, FIG. 3 schematically depicts a wafer 110 having built thereon a number of integrated circuits 120. PCM structures 130 are formed on the wafer 110 outside the die area of the integrated circuits 120. After the wafer 110 is diced into chips, the PCM structures 130 are disposed of as waste.

Rather than relying on data obtained from testing PCM structures, the adjustment of the operating voltage of a particular integrated circuit may be based on data gained from parametric measurements of one or more selected other integrated circuits fabricated in the same production run or on the same wafer as the integrated circuit whose operating voltage is being adjusted. Preferably, several integrated circuits are selected on the same wafer. By strategically choosing several integrated circuits out of the totality of integrated circuits 120, representative performance-characterizing data can be gained for all wafer areas. Thus, the selected integrated circuits function as reference circuits in substantially the same way as the PCM structures. The parameter measurements can be carried out before or after cutting the wafer 110 into chips.

Alternatively, measurements for performance-characterizing parameters may be made on a portion of the integrated circuit whose operating voltage is being adjusted. In this case, adjustment of the operating voltage of a specific integrated circuit may be based solely on the data measured for that integrated circuit.

Measurement step S1, determination step S2 and setting step S3 of FIG. 2 may all be carried out by the chip manufacturer as part of the various functional and other test procedures typically performed on chips before shipping them. In particular, adjustments to the operating voltage of individual integrated circuits may be made prior to shipping based on measured parameters of reference circuit structures in PCM structure or other integrated circuits or on measured parameters of the individual integrated circuit.

Alternatively, integrated circuit chips may have integrated thereon a suitable on-chip device that performs steps S1–S3 without the use of additional external equipment. This permits parameter measurements and operating voltage adjustments even during use of the chips. For a better understanding of such on-chip measurement and adjustment facility, refer again to FIG. 1 where a detection section 22 and an evaluation section 24 are shown as part of chip 10. As the detection section 22 and the evaluation section 24 are optional features, they are depicted in broken lines in FIG. 1. The detection section 22 is arranged to measure one or more electrical or operational parameters of the integrated circuit 12. For example, detection section 22 may measure a voltage drop across a specific structure or it may measure a leakage current or a circuit operating speed. Detection section 22 delivers its measured signals to the evaluation section 24. Evaluation section 24 is arranged to determine, based on the measured signals, a desired value for the operating voltage VCC of the integrated circuit 12 and to adjust, if necessary, the signal generator section 20 so that the latter supplies to the down-converter section 18 a signal indicative of the desired value as determined by the evaluation section 24. Advantageously, the detection section 22 may be arranged to take parameter measurements repeatedly during operation of the integrated circuit 12, e.g., continuously or in regular intervals.

The evaluation section 24 may be implemented using, for example, programmable logic or a processor. A programmable logic device can be easily programmed to perform the functions of the evaluation section 24. Similarly, a programmable logic device may also be used to form the signal generator section 20. Programmable or trimmable elements, e.g., fuses, in the signal generator section 20 enable easy adjustment of the target value of the operating voltage VCC.

In an alternative embodiment, detection section 22 and evaluation section 24 may be arranged separately from chip 10, yet on the same printed circuit board.

In summary, the present invention permits the performance of integrated circuits to be optimized and the yield to be increased by adjusting the circuit operating voltage using feedback on process/product parameters. While preferred embodiments have been described above, it will be apparent to those skilled in the art that modifications can be made without departing from the spirit and scope of the invention.

What is claimed is:

1. A voltage regulator for providing an operating voltage to an integrated circuit formed on a same chip as said voltage regulator, said voltage regulator comprising:

a voltage down-converter arranged to convert a chip-external supply voltage to the operating voltage based on a signal indicative of a desired value of the operating voltage and output the operating voltage;

an adjustable signal generator for adjustably generating the signal indicative of the desired value of the operating voltage;

a detector for measuring at least one electrical or operational parameter of the integrated circuit when the integrated circuit is operated at a nominal voltage; and an evaluator to determine the desired value of the operating voltage based on the parameter(s) measured by the detector when the integrated circuit is operated at the nominal voltage and to supply a signal to the signal generator indicative of the desired value.

2. The voltage regulator of claim 1, wherein the adjustable signal generator is implemented in a programmable logic device.

3. The voltage regulator of claim 1, wherein the evaluator is implemented in a programmable logic device.

4. A voltage regulator for providing an operating voltage to an integrated circuit formed on a same chip as said voltage regulator, said voltage regulator comprising:

a voltage down-converter arranged to convert a chip-external supply voltage to a converted voltage based on a signal indicative of a desired value of the converted voltage and output the converted voltage as the operating voltage;

an adjustable signal generator for adjustably generating the signal indicative of the desired value of the converted voltage; and a detector for measuring at least one electrical or operational parameter of a circuit of the integrated circuit when the integrated circuit is operated at a nominal voltage and producing a measurement signal that is used to control the signal generated by the signal generator.

5. The voltage regulator of claim 4, wherein the adjustable signal generator is implemented in a programmable logic device.

* * * * *